United States Patent [19]

Rennie et al.

[11] Patent Number: 5,406,574
[45] Date of Patent: Apr. 11, 1995

[54] SEMICONDUCTOR LASER DEVICE

[75] Inventors: John Rennie, Tokyo; Masaki Okajima, Kawasaki; Genichi Hatakoshi, Yokohama, all of Japan

[73] Assignee: Kabushiki Kaisha Toshiba, Kawasaki, Japan

[21] Appl. No.: 165,909

[22] Filed: Dec. 14, 1993

Related U.S. Application Data

[63] Continuation-in-part of Ser. No. 964,836, Oct. 22, 1992, abandoned.

[30] Foreign Application Priority Data

Oct. 23, 1991 [JP] Japan .................. 3-275706
Mar. 27, 1992 [JP] Japan .................. 4-071731
Dec. 14, 1992 [JP] Japan .................. 4-333124

[51] Int. Cl.⁶ .................................. H01S 3/19
[52] U.S. Cl. ........................... 372/45; 372/44
[58] Field of Search ..................... 372/43–47, 372/50

[56] References Cited

U.S. PATENT DOCUMENTS

| | | | |
|---|---|---|---|
| 4,752,934 | 6/1988 | Fukuzawa et al. | 372/46 |
| 4,802,181 | 1/1989 | Iwata | 372/45 |
| 4,961,197 | 10/1990 | Tanaka et al. | 372/45 |
| 5,105,240 | 4/1992 | Omura | 372/50 X |
| 5,132,981 | 7/1992 | Uomi et al. | 372/45 |
| 5,251,224 | 10/1993 | Irikawa et al. | 372/45 |

OTHER PUBLICATIONS

Takagi et al, "Design and Photoluminescence Study . . .", *IEEE J. Quantum Electronics*, vol. 27, No. 6, Jun. 1991, pp. 1511–1519.

Takagi et al., "Modified Multiquantum Barrier For . . .", *Electronics Letters*, vol. 27, No. 12, Jun. 6, 1991, pp. 1081–1082.

*Primary Examiner*—John D. Lee
*Attorney, Agent, or Firm*—Oblon, Spivak, McClelland, Maier & Neustadt

[57] ABSTRACT

A semiconductor laser device includes a substrate, a first cladding layer formed on the substrate, an active layer formed on the first cladding layer, and a second cladding layer formed on the active layer having a conductivity type different from that of the first cladding layer, wherein at least one of the first and second cladding layers has a multiquantum barrier structure. The width of the first quantum barrier of the multiquantum barrier structure relative to the side of the active layer is 24 to 100 nm, the width of the second quantum barrier of the multiquantum barrier structure relative to the side of the active layer is 5 to 20 nm, and the multiquantum barrier structure is constituted by alternately stacking first thin layers consisting of $In_z(Ga_{1-x}Al_x)_{1-z}P$ (x is 0.7 to 1.0 and z is 0 to 1.0) and second thin layers consisting of $In_z(Ga_{1-y}Al_y)_{1-z}P$ (y is 0 to 0.3 and z is 0 to 1.0).

5 Claims, 9 Drawing Sheets

SEMICONDUCTOR LASER DEVICE

CROSS-REFERENCE TO THE RELATED APPLICATIONS

This application is a continuation-in-part of U.S. patent application Ser. No. 07/964,836, filed on Oct. 22, 1992, now abandoned.

BACKGROUND OF THE INVENTION

1. Field of the Invention

The present invention relates to a semiconductor laser device and, more particularly, to a semiconductor laser device with a multiquantum barrier.

2. Description of the Related Art

Recently, semiconductor laser devices with double hetero-(DH) structures, capable of emitting red light having wavelengths of from 650 to 670 nm with high efficiencies, have been developed. Semiconductor laser devices of this type have advantages such as a low threshold current density, a high maximum operating temperature, and a long operating life.

If, however, the DH structure is applied to a semiconductor laser device having an oscillation wavelength of less than 650 nm, problems such as a high threshold current density and a low maximum operating temperature arise. Short-wavelength laser devices are required to realize high-density recording in optical memories and are also expected to be used as the light sources for bar-code readers. A semiconductor laser device would be expected to an attractive alternative light source for bar-code readers. This is because standard bar-code readers currently being used employ a helium-neon gas laser for the light source, having a wavelength of about 630 nm, and also the use of a semiconductor laser device enables considerable miniaturization of the light source.

It is assumed that the increase in threshold current density and the decrease in maximum operating temperature observed in currently used semiconductor laser devices, with a DH structure, operating at short wavelengths lengths of less than 650 nm are mainly due to the following reason.

That is, as the oscillation wavelength is shortened, the height of the hetero barrier in the conduction band between the active layer and the p-type cladding layer is decreased, and this allows carriers to flow from the active layer into the p-type cladding layer, thereby constituting a carrier loss.

In comparison to the aforementioned laser structures when an active region with an MQW structure is employed, its density of states distribution function exhibits a steplike characteristic, and the energy distribution of the electrons is highly localized, causing an increase in the laser gain, and thus a lowering in the threshold current density. Since the energy distribution of the electrons varies only slightly with temperature, the temperature characteristics of the device is improved, in other words, the maximum operation temperature is increased.

Thus, a semiconductor laser device having a double hetero-(DH) structure including an active layer with an MQW structure exhibits a low threshold current density, a high maximum operation temperature, and a long life, as compared to those of the semiconductor laser devices having a double hetero-structure other than the above.

However, a semiconductor laser device having an oscillation wavelength of less than 650 nm, involves such drawbacks as high threshold current density and a low maximum operation temperature. Therefore, it has been difficult to meet the recent demand for increasing the recording density, by shortening the laser wavelength used, of the optical memory devices.

The drawbacks regarding the high threshold current density and the low maximum operation temperature are due to the phenomenon whereby electrons in the active layer leak more and more easily into the p-type cladding layer as the oscillation wavelength is shortened. Such a leak of electrons can be further decreased by use of an active layer which contains strain. However, even with this method, the leak of electrons cannot be reduced to a satisfactory level for solving the above-described drawbacks.

To solve this problem, methods of forming a multiquantum barrier (MQB) between the active layer and the cladding layer has been proposed (Kishino et. al., Appl. Phys. Lett. 58 1991, p. 1822; Iga et. al., Electron Lett., 22 1986, p. 1008).

There was proposed a p-type cladding layer having a multiquantum barrier structure. The p-type cladding layer having an MQB structure will have a higher effective electron barrier against electrons in the active layer as compared to the other types of p-type cladding layers, having no MQB structure. This is because the MQB structure serves as an extra barrier produced in terms of the quantum confinement effect in the structure.

Design and fabrication of laser devices having an MQB structure (MQB semiconductor laser devices), however, involves overcoming the following problem.

That is, the MQB structure involves a large number of parameters, such as the quantum well width and the associated barrier width. To further complicate matters these parameters are mutually associated with each other. Therefore, it is difficult to set all these parameters optimally, and this in turn makes it difficult to fabricate a highly optimized MQB semiconductor laser device.

As described above, since a large number of parameters are related to the laser characteristics of conventional MQB semiconductor laser devices, these devices are difficult to design and are therefore poor in practicability.

By employing the MQB structure, laser devices which have been able to suppress the leak of electrons from the active layer into the p-type cladding layer have been developed; however, the advantage obtained by the MQB structure is not as good as expected. That is, the increase in the height of the barrier, which was theoretically expected, could not be achieved, and therefore the leakage of the electrons could not be suppressed to a low enough level sufficient for solving the above problem.

As described above, in the case of a short oscillation wavelength less than 650 nm, the problem of leaking of electrons from the active layer exhibits a prominent effect, causing a high threshold current density and a low maximum operation temperature.

In order to solve the above problem, there were proposed some techniques in which a strained active layer and a p-type cladding layer having an MQB structure were used. However, with these techniques, it was still not possible to reduce the leakage of electrons to a satisfactory low level, and the above problem remains unsolved.

SUMMARY OF THE INVENTION

The present invention has been made in consideration of the above situation and has as its object to provide a more practical MQB semiconductor laser device.

According to the present invention, there is provided a semiconductor laser device comprising of a substrate, a first cladding layer formed on the substrate, an active layer formed on the first cladding layer, and a second cladding layer formed on the active layer and having a conductivity type different from that of the first cladding layer, wherein at least one of the first and second cladding layers has a multiquantum barrier structure including a plurality of barrier layers and a plurality of well layers, each barrier layer and each well layer being alternately stacked, the width of the first barrier layer on the side of the said active layer being 24 to 100 nm, the width of a second barrier layer on the side of the said active layer being 5 to 20 nm.

In addition, according to the present invention, there is provided a semiconductor laser device comprising a substrate, a first cladding layer formed on the substrate, an active layer formed on the first cladding layer, and a second cladding layer formed on the active layer and having a conductivity type different from that of the first cladding layer, wherein at least one of the first and second cladding layers has a multiquantum barrier structure including a plurality of barrier layers and a plurality of well layers formed of a material different from that of the barrier layers, each barrier layer and each well layer being alternately stacked, the effective mass of the electrons in the said barrier layer being larger than that of the said well layer, the width of the first barrier layer on the side of the said active layer being 24 to 100 nm, with tensile strain being introduced in the said well layer.

Further, according to the present invention, there is provided a semiconductor laser device comprising a substrate, a first cladding layer formed on the substrate, an active layer formed on the first cladding layer, and a second cladding layer formed on the active layer and having a conductivity type different from that of the first cladding layer, wherein at least one of the first and second cladding layers has a multiquantum barrier structure including a plurality of barrier layers and a plurality of well layers formed of a material different from that of the barrier layers, each barrier layer and each well layer being alternately stacked, the effective mass of the electrons in the said barrier layer being larger than that of the said well layer, the width of the first barrier layer relative to the said active layer being 24 to 100 nm, with tensile strain represented by the following inequality being introduced into the said well layer.

$$-2\% > \Delta a/a > -1\%$$

(where a is the lattice constant of the substrate, and $\Delta a$ is a difference between the lattice constant of the well layer and that of the substrate.)

Still further, according to the present invention, there is provided a semiconductor laser device comprising of a substrate, a first cladding layer formed on the said substrate, an active layer formed on the said first cladding layer, and a second cladding layer formed on the said active layer and having a conductivity type different from that of the said first cladding layer, wherein at least one of the said first and second cladding layers has a multiquantum barrier structure, and the said multiquantum barrier structure is constituted by alternately stacking a plurality of barrier layers each consisting essentially of $In_z Ga_{1-x}Al_x)_{1-z}P$ (where x is 0.7 to 1.0 and z is 0 to 1.0) and a plurality of well layers each consisting essentially of $In_z(Ga_{1-y}Al_y)_{1-z}P$ (where M is 0 to 0.3 and z is 0 to 1.0), the width of the first barrier layer on the side of the said active layer being 24 to 100 nm, the width of the second barrier layer on the side of the said active layer being 5 to 20 nm.

Still further, there is provided a semiconductor laser device comprising a substrate, a first cladding layer formed on the said substrate, an active layer formed on the said first cladding layer, and a second cladding layer formed on the said active layer and having a conductivity type different from that of the said first cladding layer, wherein at least one of the said first and second cladding layers has a multiquantum barrier structure, and the said multiquantum barrier structure is constituted by alternately stacking a plurality of barrier layers each consisting essentially of $In_z(Ga_{1-x}Al_x)_{1-z}P$ (where x is 0.7 to 1.0 and z is 0 to 0.5) and a plurality of well layers each consisting essentially of $In_{1-u}Ga_uAs_{1-v}P_v$ (where u is 0 to 0.45 and v is 0.6 to 1), the width of a first barrier layer on the side of the said active layer being 24 to 100 nm, the width of the second barrier layer on the side of the said active layer being 5 to 20 nm, with tensile strain represented by the following inequality being introduced into the said well layer.

$$-2\% > \Delta a/a > -1\%$$

(where a is a lattice constant of the substrate, and $\Delta a$ is the difference between the lattice constant of the well layer and that of the substrate.)

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, together with the general description given above and the detailed description of the preferred embodiments given below, serve to explain the principles of the invention.

DETAILED DESCRIPTION OF THE PREFERRED EMBODIMENTS

A semiconductor laser device according to the present invention comprises a substrate, a first cladding layer formed on the substrate, an active layer formed on the first cladding layer, and a second cladding layer formed on the active layer and having a conductivity type different from that of the first cladding layer. At least one of the first and second cladding layers has a multiquantum barrier structure.

In a semiconductor laser device according to the first aspect of the present invention, the width of the first quantum barrier of the multiquantum barrier structure relative to the active layer side is 24 to 100 nm, preferably 24 to 60 nm, and the width of the second quantum barrier relative to the active layer side is 5 to 20 nm, preferably 5 to 10 nm.

If the width of the first quantum barrier is less than 24 nm, then the barrier ceases to act as a classical barrier due to quantum tunneling effects and is thus insufficient and the overall barrier height of the quantum barrier becomes low; if it exceeds 100 nm, then the multiquantum barrier effect is too distant from the active region of the device and thus it's effect on the electrons leaking from the active region decreases, too much, and it is undesirable.

If the width of the second quantum barrier is less than 5 nm, a gap of low reflectivity is generated between the classical and the multiquantum barrier constituents of the overall reflectivity spectrum; if it exceeds 20 nm, the first quantum well is insufficiently coupled with the second quantum barrier.

In a semiconductor laser device according to the second aspect of the present invention, the material constituting the quantum well of the multiquantum barrier structure is different from that constituting the quantum barrier, the width of the first quantum barrier of the multiquantum barrier structure relative to the active layer side is 24 to 100 nm, preferably 24 to 60 nm, and tensile strain is introduced in the quantum well.

Thus, since the material for the well is different from that for the barrier, the effective mass of electrons in the well can be made less than that of the conventional MQB structure.

Consequently, the electron reflectivity of the MQB becomes large and the overflow of electrons can be suppressed. Further, since tensile strain is introduced into the well, the subsequent drop in bandgap level related to the decrease in effective mass can be compensated for, and thus, a practical semiconductor laser device without deterioration in threshold current density and maximum operation temperature can be obtained even for short oscillation wavelength lasers.

In the semiconductor laser of each of the above aspects, it is preferable to set the other parameters as follows.

1. The widths of the third and subsequent quantum barriers of the multiquantum barrier structure relative to the active layer side are set to 1 to 8 nm.
2. The quantum well width of the multiquantum barrier structure is set to 1 to 8 nm.
3. The number of quantum barriers in the multiquantum barrier structure is set to 3 to 10.
4. As for the material of the quantum wells of the multiquantum barrier structure, $ZnSe_xTe_{1-x}$, $ZnCd_xSe$, $ZnS_xTe_{1-x}$, $Zn_{1-x}Cd_xS$, or their alloy $Zn_{1-x}Cd_xSe_{1-y-z}S_yTe_z$ is used. Alternatively, $In_{1-x}Ga_xAs_{1-y}P_y$, $Ga_{1-x}Al_xAs$, $In_z(Ga_{1-x}Al_x)_{1-z}N$ or $In_z(Ga_{1-x}Al_x)_{1-z}P$ is used. In these formulas, x and y are determined so as to satisfy inequalities $0<x<1$, and $0<y<1$.
5. As for the material of the quantum barriers of the multiquantum barrier structure, $ZnSe_xTe_{1-x}$, $ZnCd_xSe$, $ZnS_xTe_{1-x}$, $Zn_{1-x}Cd_xS$, $Zn_{1-x}Cd_xSe_{1-y-z}S_yTe_z$, $ZnS_ySe_{1-y}$, $Zn_xCd_{1-x}S_ySe_{1-y}$, $Zn_xMg_{1-x}S_ySe_{1-y}$, $In_{1-x}Ga_xAs_{1-y}P_y$, $Ga_{1-x}Al_xAs$, $In_z(Ga_{1-x}Al_x)_{1-z}N$ or $In_z(Ga_{1-x}Al_x)_{1-z}P$ can be used. In these formulas, x, y and z are determined so as to satisfy inequalities $0<x<1$, $0<y<1$, and $0<z<1$.

According to the studies of the present inventors, it is found that when $In_z(Ga_{1-x}Al_x)_{1-z}P$ is used as the material of the cladding layers, the laser characteristics, such as the threshold current density and the laser gain, largely depend on the composition ratio x (barrier layer composition ratio) of $In_z(Ga_{1-x}Al_x)_{1-z}P$ constituting the quantum barriers, the number of quantum barriers, the quantum barrier width, the quantum well width, and a composition ratio y (well layer composition ratio) of $In_z(Ga_{1-x}Al_x)_{1-z}P$ constituting the quantum wells.

When, therefore, attention is focused on these parameters, there is almost no necessity for taking into account the other parameters, and this makes a highly efficient design feasible.

Embodiments of the present invention will be described below with reference to the accompanying drawings.

Figure 1:
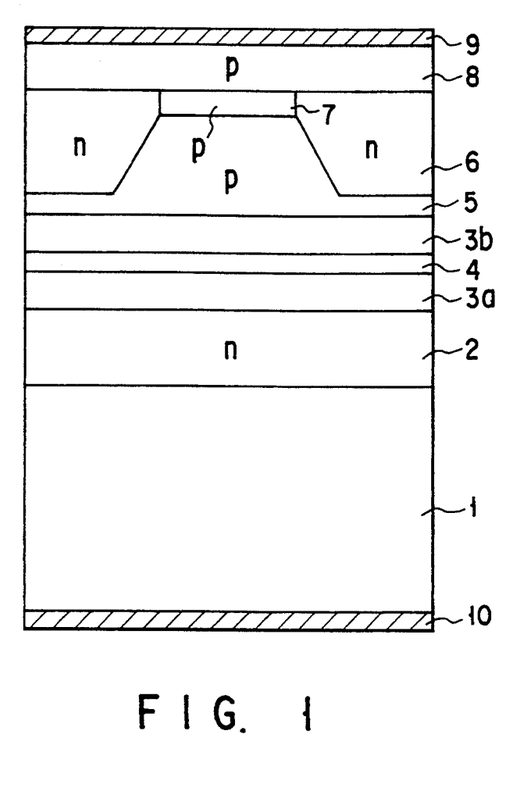
FIG. 1 is a sectional view showing the main part of a semiconductor laser having an MQB structure according to one embodiment of the present invention.

FIG. 1 is a sectional view showing the main part of an MQB semiconductor laser according to one embodiment of the present invention. Referring to FIG. 1, an n-type cladding layer 2 consisting of n-type $In_{0.5}(Ga_{1-x}Al_x)_{0.5}P$ and having a thickness of about 0.8 μm is formed on a GaAs substrate 1. An active layer 4, sandwiched between optical guide layers 3a and 3b, consisting of undoped $In_{0.5}(Ga_{1-y}Al_y)_{0.5}P$ is formed on the n-type cladding layer 2.

A P (lower case)-type cladding layer 5 having an MQB structure consisting of p-type $In_{0.5}(Ga_{1-x}Al_x)_{0.5}P$ and having a thickness of about 0.8 μm is formed on the optical guide layer 3b, and the central portion of layer 5 is formed into a mesa. The p-type cladding layer 5 having such a mesa is formed by using conventional etching techniques. The p-type cladding layer 5 is so etched in order to increase the current density in the active region upon application of a current and to enable transverse mode control of the laser light by producing a refractive index difference in the transverse direction. The p-type cladding layer 5, together with the n-type cladding layer 2, the optical guide layers 3a and 3b, and the active layer 4 constitutes the DH structure of the device.

The p-type capping layer 7 consisting of p-type InGaP is formed on the mesa portion of the p-type cladding layer 5. The remaining exposed portions of the p-type cladding layer 5 and the sides of the p-type capping layer 7 are covered with an n-type current blocking layer 6 consisting of n-type GaAs. An Au/Zn p-type electrode 9 is formed on the n-type current blocking layer 6 and the p-type capping layer 7 via a p-type contact layer 8 consisting of p-type GaAs. An Au/Ge n-type electrode 10 is formed on the other side of the substrate 1.

Note, in the embodiment shown in FIG. 1, that the Al composition ratio x of the cladding layers 2 and 5 is 0.7. The active layer 4 may be any light-emitting layer and may have a uniform structure such as a double heterostructure or a modulated structure, such as an MQW structure.

Figure 2:
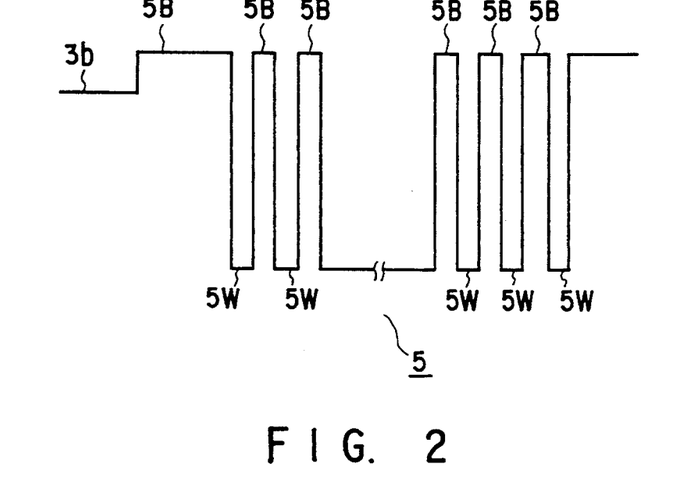
FIG. 2 is a view showing the conduction band edge profile of the MQB structure of the semiconductor laser shown in FIG. 1.

FIG. 2 is a band diagram showing the conduction band edge profile of a p-type cladding layer 5 having an MQB structure. FIG. 2 reveals that the conduction band of the p-type cladding layer 5 is modulated. That is, the p-type cladding layer 5 has a structure in which two types of thin layers (i.e., $In_{0.5}Ga_{0.5}P$ films and $In_{0.5}(Ga_{0.3}Al_{0.7})_{0.5}P$ films) having different compositions are alternately stacked to periodically form quantum wells 5W and quantum barriers 5B.

In this embodiment, to improve the laser characteristics, such as the threshold current and the maximum operating temperature, various parameters are optimized by focusing attention on the reflectivity of electrons. This optimization is performed by increasing the reflectivity of electrons from the multiquantum barrier structure.

Figure 3:
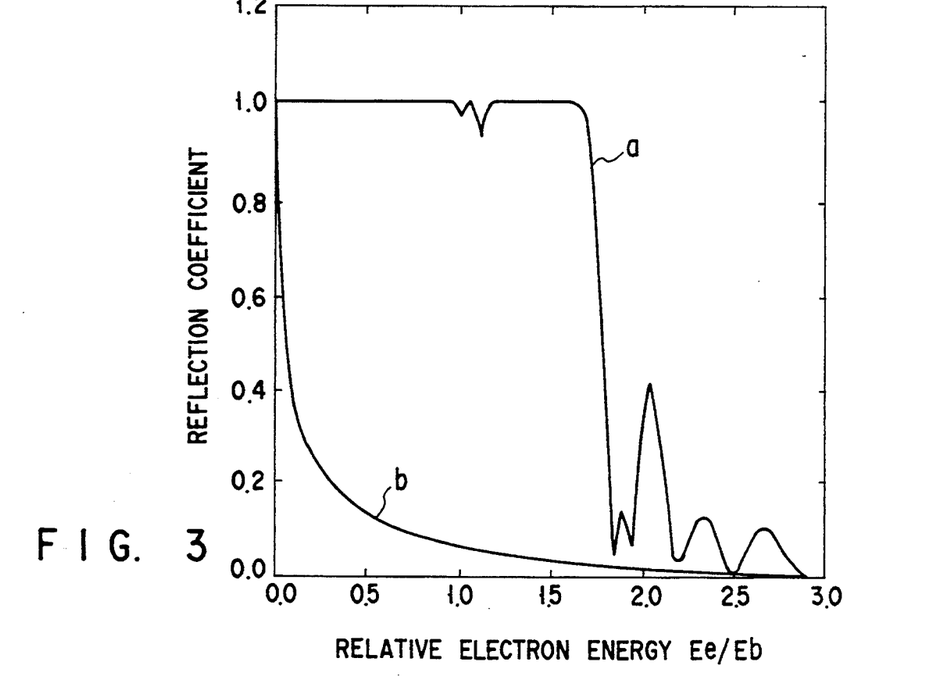
FIG. 3 is a graph showing the relationship between the electron reflection coefficient of the MQB and the relative electron energy.

FIG. 3 is a graph showing the reflection coefficient of electrons as a function of the relative electron energy. Referring to FIG. 3, curve b is the characteristic representative of a classical barrier, i.e., the characteristic based on the assumption, as derived from the classical physics, that electrons having an energy lower than the energetic height of the hetero barrier are reflected. Curve a represents the characteristic of a multiquantum barrier, i.e., the characteristic obtained when the cladding layer has the MQB structure. In this MQB structure, the first barrier has an optimum thickness of 30 nm and the second barrier has an optimum thickness of 8 nm. FIG. 3 reveals that in the case of the classical barrier, if the energy of electrons exceeds the height of the hereto barrier, the reflection coefficient abruptly decreases. In the case of the MQB structure, on the other hand, a reflectivity of 1.0 is maintained, over a certain range, even when the electron energy exceeds the height of the hereto barrier.

Figure 4:
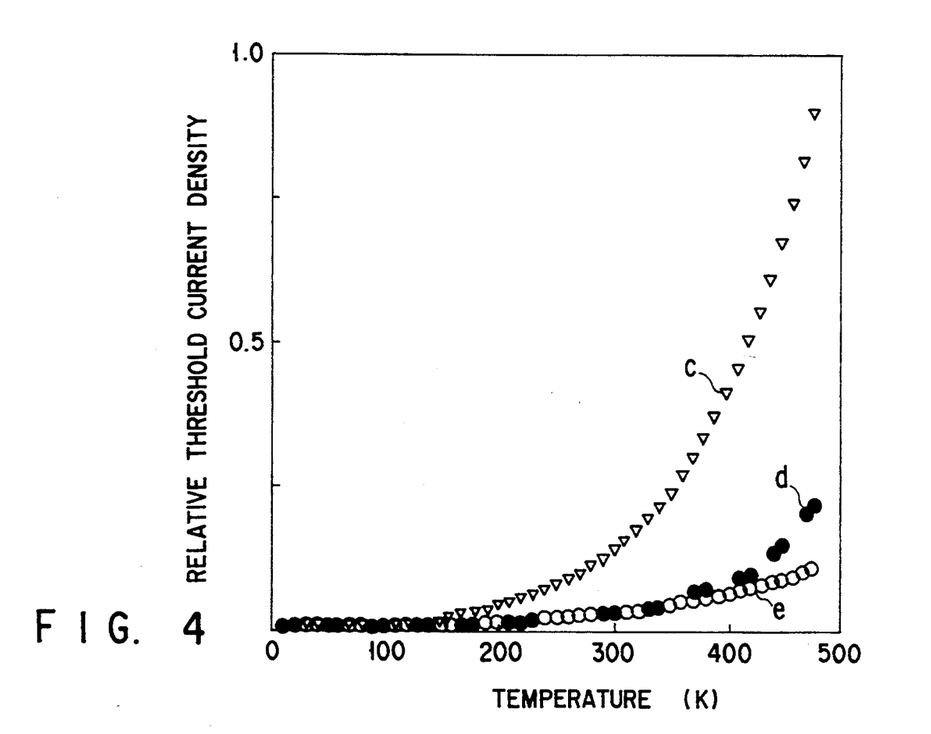
FIG. 4 is a graph showing the relationship between the temperature and the relative threshold current density.

FIG. 4 is a graph showing the relationship between the ambient temperature and the relative threshold current density. In FIG. 4, curve c represents the characteristic obtained when the MQB structure is not adopted in the p-type cladding layer, and curve d represents that obtained when the MQB structure is adopted in the p-type cladding layer. Curve e represents the characteristic of an ideal laser free from overflow of carriers from the active layer into the p-type cladding layer. As is apparent from FIG. 4, the relative threshold current can be improved by using the MQB structure in the p-type cladding layer, and realizes a laser characteristic close to the ideal laser characteristic indicated by the curve e. This effect stems from the fact that the MQB structure in the p-type cladding layer maintains a reflection coefficient of 1.0 even if the electron energy exceeds the energetic height of the hetero barrier.

In this embodiment, various parameters are set as follows in consideration of the above findings.

The reflectivity is affected by the barrier composition ratio x of $In_{0.5}(Ga_{1-x}Al_x)_{0.5}P$ constituting the quantum barriers of the p-type cladding layer 5 and the well layer composition ratio y of $In_{0.5}(Ga_{1-y}Al_y)_{0.5}P$ constituting the quantum wells of the p-type cladding layer 5. That is, as the conduction band gap difference (offset) between the quantum barriers and the quantum wells is increased, the reflectivity, with respect to electrons with a high energy, is increased. In general, therefore, the effect is enhanced as the barrier layer composition ratio x is increased.

It is found that a good result can be obtained by employing a barrier layer composition ratio x within the range of 0.7 to 1.0 in accordance with the relationship with the value of the quantum well layer composition ratio.

It is desirable, on the other hand, that the well layer composition ratio y be 0 in order to maximize the offset. However, if the composition ratio of the active layer is larger than the well layer composition ratio y and the quantum well width is also large, a significant loss of either carriers, due to preferential recombination in the MQB, or, more seriously, due to the direct absorption of the light emitted from the active region in the MQB is observed. When this influence of the composition of the active layer is taken into account, an optimal MQB well layer composition ratio y depends on the composition ratio of the active layer, and it is generally in the range 0 to 0.3.

In place of $In_{0.5}(Ga_{1-y}Al_y)_{0.5}P$, another semiconductor material which allows lattice matching can be used as the material in the quantum well layer. The effect of the MQB, as described above, is enhanced as the band gap of the well layer becomes small compared to that of the barrier layer and the wells effective mass decreases with respect to the barriers. Examples of such well layer materials are GaAs, GaAlAs, and InGaAs.

Figure 5:
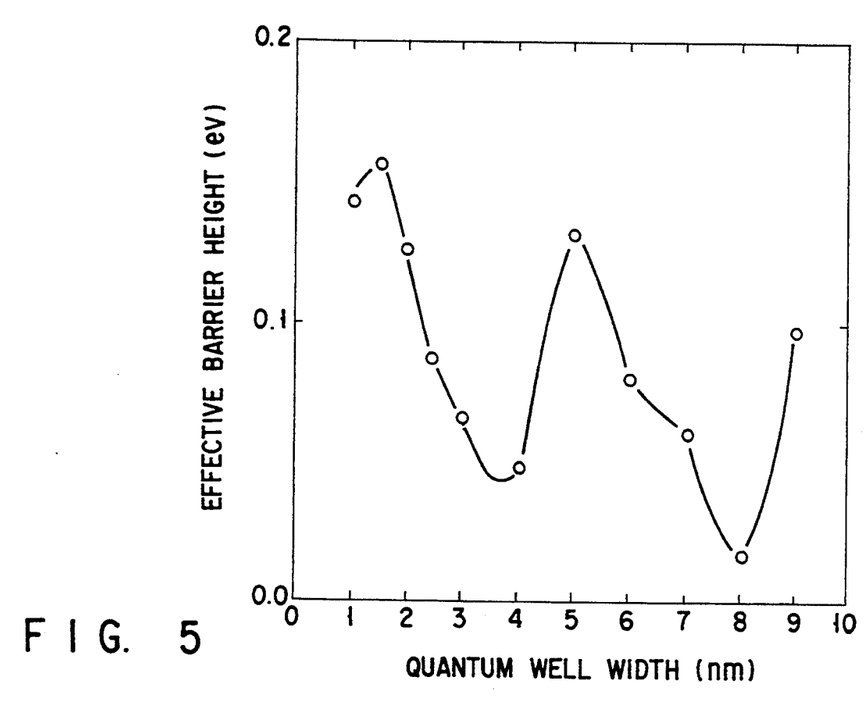
FIG. 5 is a graph showing the relationship between the quantum well width and the effective barrier height.

FIG. 5 is a graph showing the relationship between the quantum well width and the effective barrier height when the number of barriers is ten. It is obvious from FIG. 5 that the effective barrier height generally increases as the quantum well width decreases. This is so because when the quantum well width decreases, the quantum interference effect is enhanced even for electrons with a high energy, and this increases the reflectivity. With this improvement in effective barrier height, the overflow of carriers is suppressed, and the laser characteristics such as the threshold current density are improved. Note that the effective barrier height decreases when the quantum well width is below 1.5 nm. This is because the MQB gradually, as the width goes to zero, becomes a quasi-bulk material. Note also that though a smaller quantum well width is generally more preferable, as described above, it is difficult to decrease the quantum well width to 0.3 nm or less using present film forming techniques.

When the quantum well width is large, on the other hand, almost no interference effect with respect to a high-energy electron wave can be obtained. In addition, if the quantum well width is large, problems, such as direct absorption of the devices active regions emission in the MQB quantum wells, occur to degrade the laser characteristics.

When, therefore, these conditions are taken into consideration, the optimal quantum well width can be selected to be 1.0 to 8 nm.

Note that the quantum well depth can be controlled by the quantum well width. That is, when the quantum well depth increases, the multiquantum barrier height also increases. Therefore, the quantum well depth can be increased by an amount corresponding to an increase in the quantum well width. Note that the range of control by the quantum well width is limited by the semiconductor material used.

If a barrier layer width is too narrow, the transmission coefficient of electrons increases significantly for all energies, so that the barrier cannot function as what is thought of as a classical barrier. If, on the other hand, the MQB barriers width is too thick, the interference effect between the quantum wells decreases, and makes it impossible to obtain a satisfactorily large effective MQB induced barrier height. In addition, since the position of the barriers affects their required characteristics, it is necessary to determine an optimal width for each quantum barrier in turn.

That is, the first barrier relative to the active layer 4 side must behave as a classical barrier of width determined by the quantum tunneling width limit with respect to electrons. For this reason, the quantum barrier width must be 24 nm or more. In addition, the quantum barrier width must be 100 nm or less for the reason described below.

Figure 6:
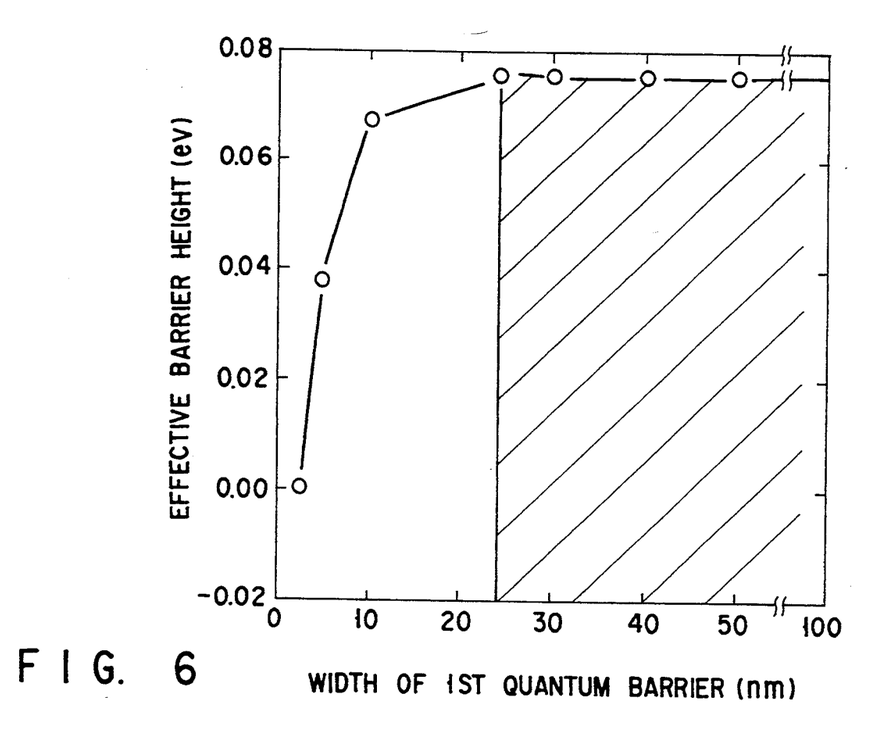
FIG. 6 is a graph showing the relationship between the width of the first quantum barrier and the effective barrier height.

FIG. 6 is a graph showing the relationship between the width of the first quantum barrier relative to the active layer side and the effective MQB barrier height when the number of barriers is ten. In general, as is apparent from FIG. 6, when the width of the first barrier increases, the effective barrier height also increases.

It is assumed that this effect is obtained since the first barrier plays a role as the classical barrier represented by the curve b shown in FIG. 3. That is, the first barrier must be a classical barrier determined by the quantum tunneling width limit with respect to electrons. If the first barrier width is too thin, no classical barrier can be obtained, resulting in a decrease in effective MQB quantum barrier height. If, on the other hand, the first barrier width is 24 nm or more, the effective MQB quantum barrier height appears to saturate. However, if the first barrier width is more than 100 nm, the MQB induced barrier is spatially separated from the active region so that it has decreasingly little or no positive effect on the overflow of electrons from the active region into the p-cladding region. As a result, the MQB effect is undesirably lost.

When these conditions are taken into account, therefore, the first barrier width should be 24 to 100 nm.

To assist the function of the first barrier as a classical barrier, the second barrier relative to the active layer 4 side must have a considerable thickness compared to the subsequent barriers in the MQB. According to the study of the present inventors, it is found that an optimal range is 5 to 20 nm. Note that the lower limit is determined in consideration of film forming techniques for barrier materials.

Figure 7:
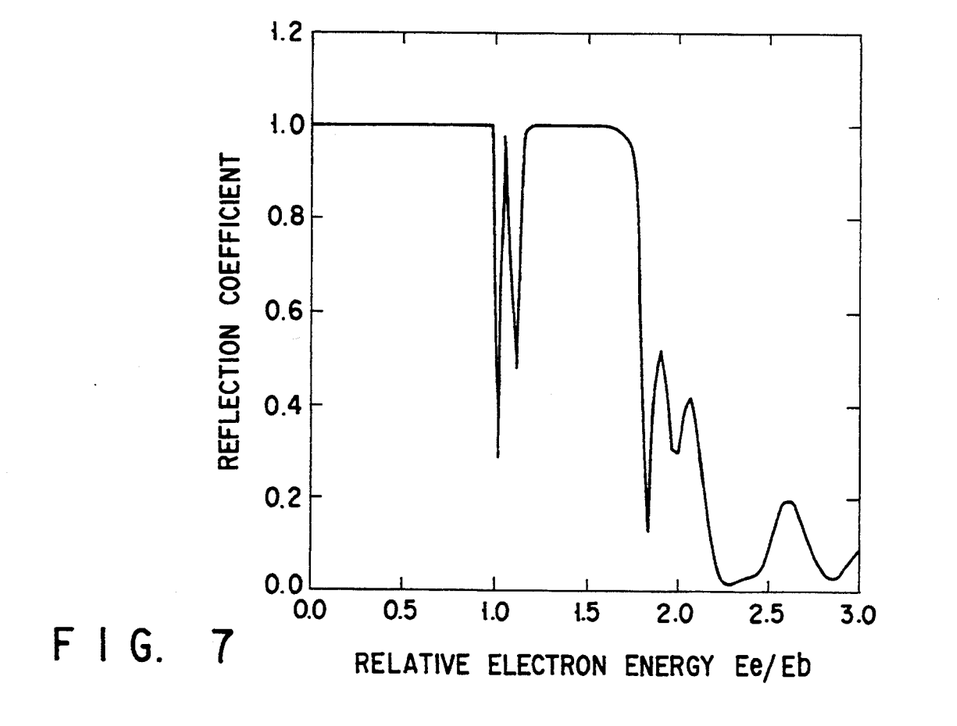
FIG. 7 is a graph showing the relationship between the electron reflection coefficient of the MQB and the relative electron energy.
Figure 8:
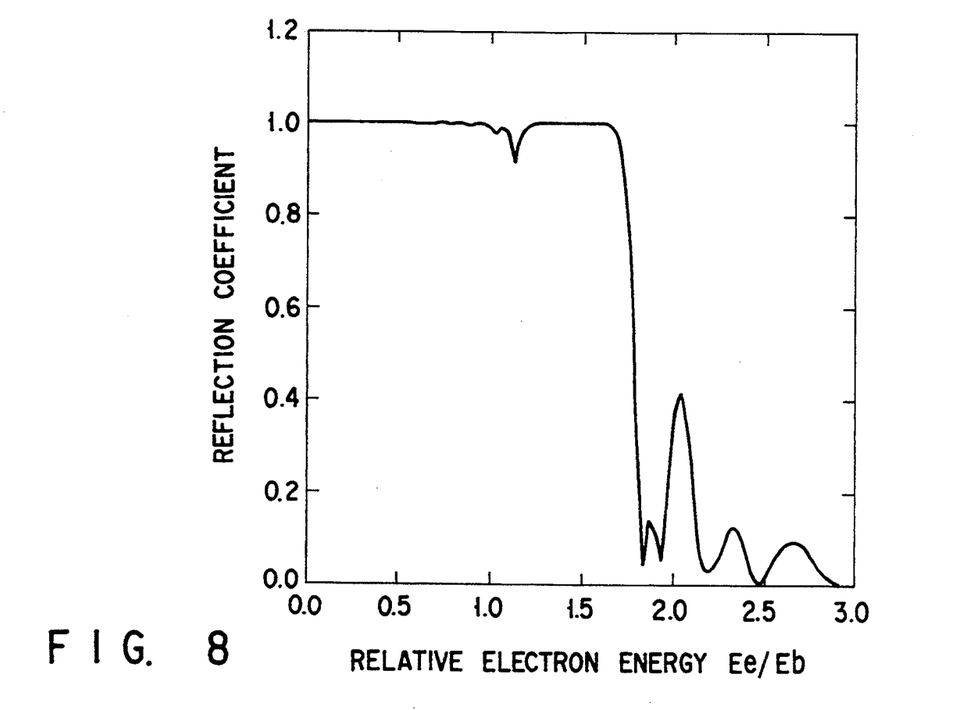
FIG. 8 is a graph showing the relationship between the electron reflection coefficient of the MQB and the relative electron energy.

As described above, in one embodiment of the present invention, it is necessary to satisfy two essential conditions which are interdependent. These are that the first barrier must have a width of 24 to 100 nm and the second barrier must have a width of 5 to 20 nm. When either one of the conditions is not satisfied, a severe reduction in the reflection coefficient is observed at an electron energy equal to the barrier height, as shown in FIG. 7. It should be noted that FIG. 7 shows the case in which the first barrier width is 30 nm and the second barrier width is 2 nm. FIG. 8 shows the case in which both requirements are satisfied, that is the first barrier width is 30 nm and the second barrier width is 8 nm. Thus, for an optimum design these two interdependent parameters must be considered together.

The widths of the third and subsequent barriers relative to the active layer 4 side will be described below.

Figure 9:
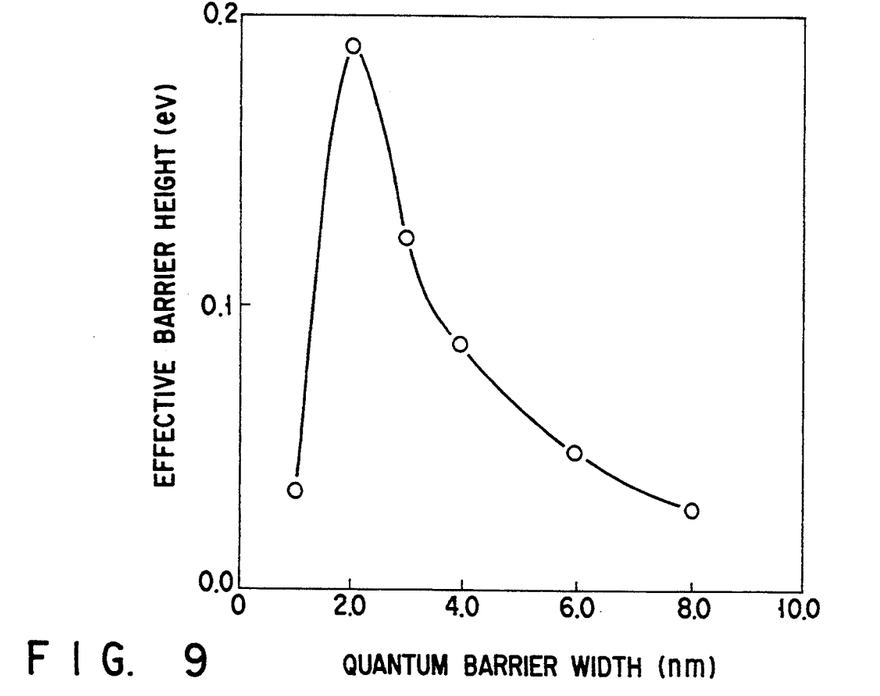
FIG. 9 is a graph showing the relationship between the quantum barrier width and the effective barrier height.

FIG. 9 is a graph showing the relationship between the remaining barrier widths, i.e., barrier three onwards, and the effective barrier height induced by the MQB effect when the number of barriers is ten. FIG. 9 reveals that the effective barrier height is small for barrier width of 8.0 nm, and subsequently increases as the barrier width decreases, peaking when the barrier width is about 2.0 nm, and decreases thereafter. Therefore, to optimize the MQB effect, the barrier widths of the third and subsequent barriers should be set from 1 to 8 nm.

As described above, when the individual parameters were set at the respective appropriate values, significant improvements could be obtained by a synergistic effect, i.e., the magnitude of the overall effect is more than the sum of improvements obtained by adjusting individual parameters.

According to this embodiment, therefore, the selection of parameters as described above makes it possible to easily obtain a semiconductor laser device having excellent laser characteristics, such as high maximum operating temperature, low threshold current density, and capable of short-wavelength oscillation.

Figure 10:
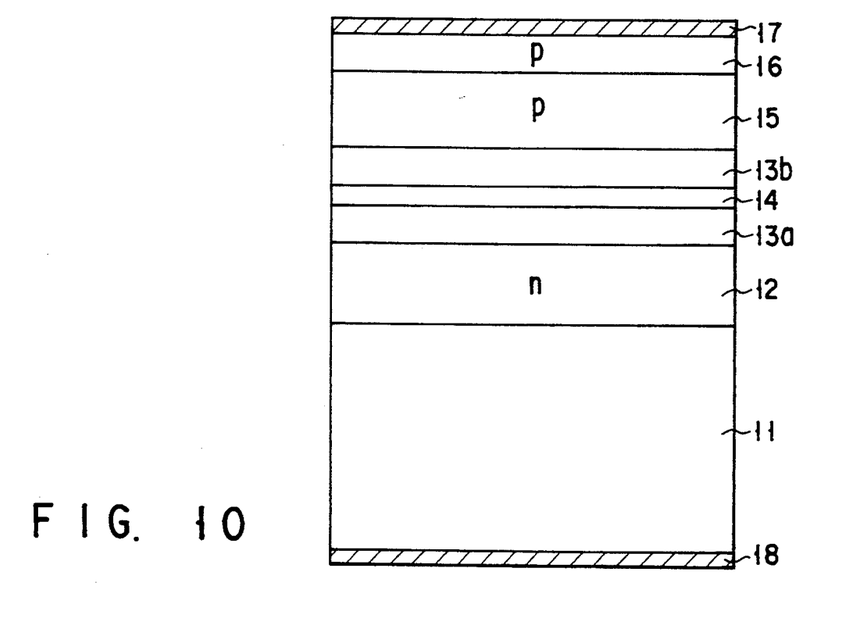
FIG. 10 is a sectional view showing the main part of an MQB laser according to another embodiment of the present invention.

FIG. 10 is a sectional view showing the main part of an MQB semiconductor laser device according to another embodiment of the present invention.

An n-type cladding layer 12 consisting of $ZnS_xSe_{1-x}$, for example, $ZnS_{0.1}Se_{0.9}$ and having a thickness of about 0.8 µm is formed on a GaAs substrate 11. An active layer 14 consisting of $Zn_{0.8}Cd_{0.2}S_{0.05}Se_{0.95}$ and sandwiched between optical guide layers 13a and 13b consisting of nondoped $ZnS_{0.05}Se_{0.95}$ is formed on the n-type cladding layer 12.

A p-type cladding layer 15 having an MQB structure consisting of $ZnS_xSe_{1-x}$, for example, $ZnS_{0.1}Se_{0.9}$ and having a thickness of about 0.8 µm is formed on the optical guide layer 13b. This p-type cladding layer 15, together with the n-type cladding layer 12, the guide layers 13a and 13b, and the active layer 14, constitutes a double heterojunction.

An Au/Zn p-type electrode 17 is formed on the p-type cladding layer 15 via a p-type contact layer 16 consisting of p-type GaAs. An Au/Ge n-type electrode 18 is formed on the other side of the substrate 11.

Figure 11:
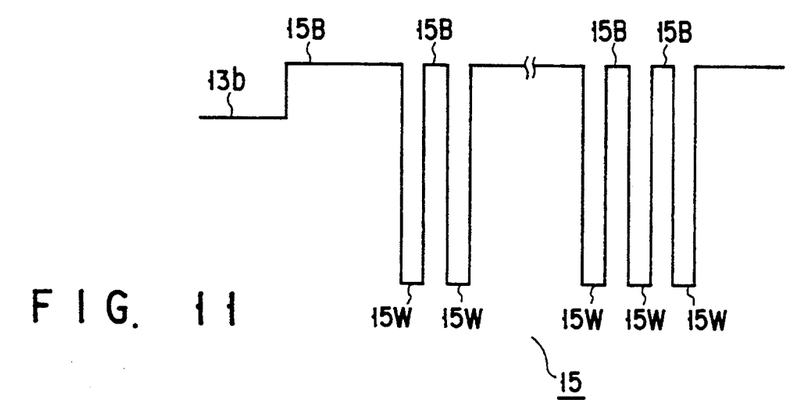
FIG. 11 is a view showing the conduction band edge profile of the MQB semiconductor laser shown in FIG. 10.

FIG. 11 shows the conduction band edge profile of the MQB structure constituted by the guide layer 13b and the p-type cladding layer 15. As is apparent from FIG. 11, the conduction band of the p-type cladding layer 15 is modulated. That is, wells 15W and barriers 15B are formed.

In most II-VI semiconductor materials there has always been the problem of the inability to make Ohmic contacts to them. In the past, where such materials have been extensively used as phosphors, this disability was not a liability due to the fact that no such contact was necessary. However, with the development of molecular beam epitaxy (MBE) growth techniques, resulting in the successful growth of highly p-doped ZnSe, the first practical optical devices, such as LED's and lasers, have become realizable. However, such devices only operate at low temperatures due to excessive heat energy released at the contact regions due to the lack of Ohmic contacts. This problem occurs due to the extremely large bandgaps of II-VI's used for blue devices (for example 2.7 eV for ZnSe) in comparison to the more conventional GaAs (1.42 eV). Most of this difference appears in the offset in the valency bands and, thus, it is especially in this case that the manufacture of Ohmic contacts is the most difficult.

Figure 16A:
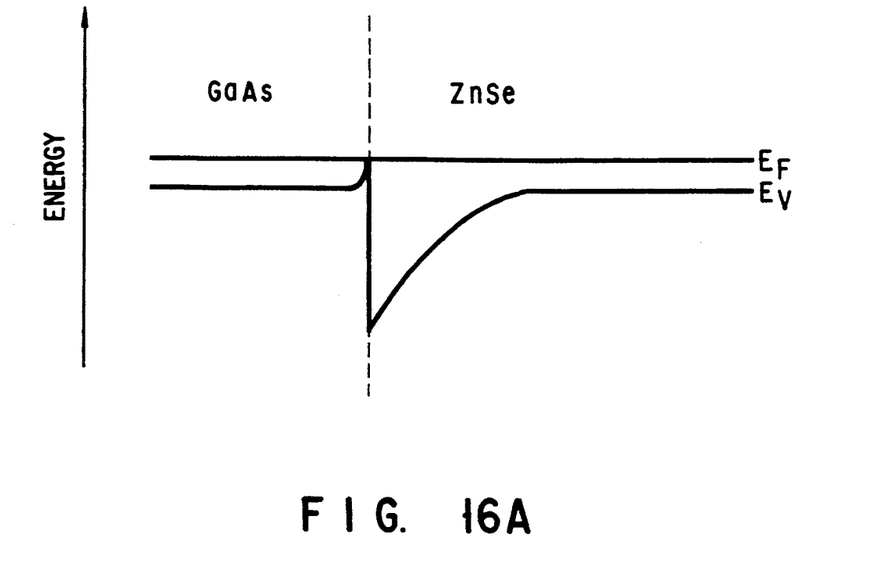
FIGS. 16A and 16B are views showing the valency band offset between GaAs and ZnSe.

An example of this kind of problem is shown in FIG. 16A for the valency band offset between GaAs and ZnSe. Since Ohmic metallic contacts can easily be made to GaAs type compounds it is from these kinds of compounds that injection of carriers into the II-VI devices takes place; one of the main reasons for this choice is that II-VI compounds can be lattice matched to GaAs; of which high purity wafers for use as substrates are readily available. From this schematic it can be seen that to inject holes into ZnSe requires a substantial barrier to be overcome. In such devices to date such junctions have resulted in operation voltages in excess of 20 V; such voltages being required to skew the bands enough to effectively reduce the overall barrier height. Such large voltages create substantial heat energy within the devices severely limiting device performance.

Figure 16B:
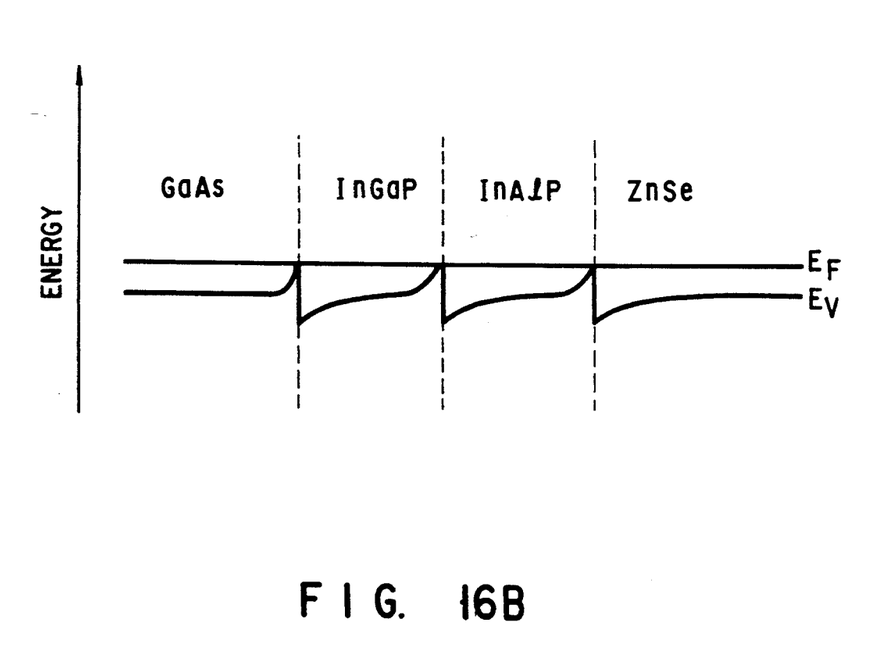

One way to overcome such a large barrier is to use some intermediate steps in the bandgap offsets from GaAs to ZnSe to allow the holes to thermally gradually climb over the barriers without the need for large voltages. Such an example is shown in FIG. 16B. In this case the main barrier height is effective split into two smaller barriers in succession. The materials used, in this case, to produce such a stepped structure are InGaP and InAlP. It is of course possible to restrict the number of such layers to one or further extend the number. Examples of potentially usable materials for this kind of structure are alloys in the system of $In_{y-1}(Ga_{x-1}Al_x)_yP$ and $Al_xGa_{x-1}As$ alloys.

Also, although the example is for injection into ZnSe it is also relevant to injection into other II-VI materials such as the $Zn_xMg_{1-x}S_ySe_{1-y}$ system or the $Cd_xZn_{x-1}Se$ systems. The use of strain, for example tensile strain, in the layers intermediate between GaAs and ZnSe to further reduce the valency band step is also a highly viable method to further improve hole injection into II-VI materials.

Figure 17:
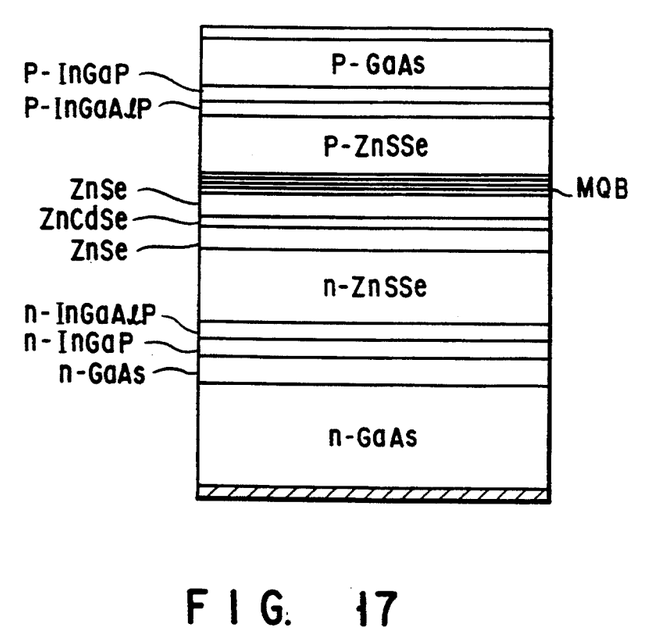
FIG. 17 is a sectional view showing the main part of an MQB laser according to another embodiment of the present invention.
Figure 18:
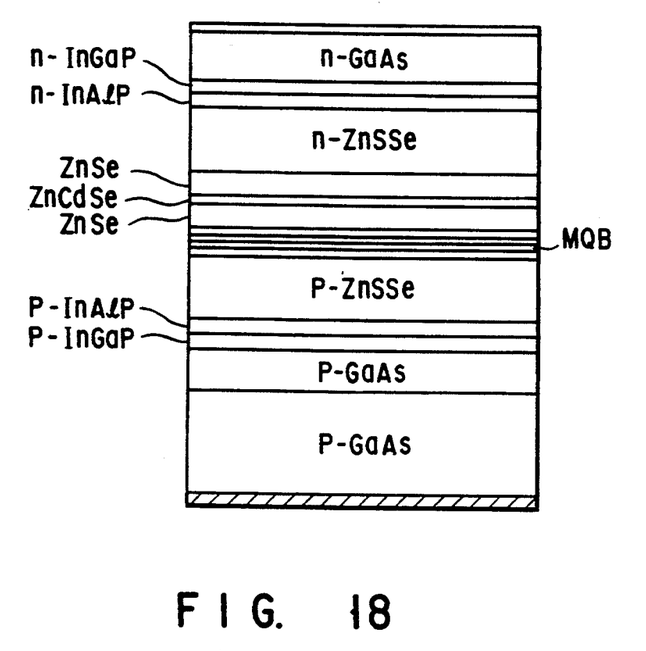
FIG. 18 is a sectional view showing the main part of an MQB laser according to another embodiment of the present invention.

FIGS. 17 and 18 illustrate two such light emitting structures containing an MQB structure in the p-cladding region adjacent to the active and guiding regions of the devices. Note that both n-type and p-type substrate devices are shown. Both these structures follow the same basic symmetric construction that is common in visible light emitting III-V LED and laser structures. This structure will now be briefly described.

On top of the GaAs substrate is grown a buffer region of GaAs followed by the stepped bandgap region being either InGaP/InAlP or InGaP/InGaAlP in the examples given. The first cladding region of the device is then grown; being of ZnSSe in this case. The active part of the device now follows with a guide layer of ZnSe which has a refractive index such that any emission will be guided back into the active region. This guide layer is followed by the active region of ZnCdSe having a bandgap less than that of the guide regions which in turn are less than that of the cladding regions. This bandgap profile confines the carriers to the active region of the device. On top of the active region is a similar guide layer followed by a cladding region of doping type opposite to the previous cladding region. These are followed by the band gap offset stepping regions which step the band gap down to a GaAs layer to which a metallic contact can be alloyed to form an Ohmic contact. A similar metallic contact is formed on the reverse side of the device, that is directly to the substrate.

The reason for the requirement of an MQB structure will now be explained. Although the potential wavelength range of II-VI compounds stretches from the infra-red (for example CdTe, 1.65 eV) to the ultra-violet (MgS, 4.5 ev) there are some limits on the materials that can be used. One factor is that blue emission is required from such devices as shorter wavelengths are amply supported by the easier to grow III-V compounds. Thus, this reduces the bandgap offset range from approximately 3 eV to 2 eV (blue emission being around 2.6 eV. Magnesium compounds containing a large percentage of Mg are highly unstable and are thus not practical for use in commercial devices. Also, MgS and MgSe are not lattice matched to GaAs meaning that the range of II-VI alloys containing Mg that are of use is limited. This, brings the potential bandgap offset down to under 1 ev.

Even 1 eV seems large for such devices until it is realized that the majority of this offset is present in the valency bands of the materials and only a smaller percentage of offset is observed in the conduction bands. Since electrons are much lighter than holes in most II-VI materials confining the electrons to the active region will be a large problem with the limited offset in the conduction bands available. This is also exacerbated by the excess heat produced by the lack of Ohmic contacts as, due to this increase in device temperature, means that larger than usual band offsets are required for these devices to operate. Thus, a combination of both the MQB structure along with a stepped bandgap contact region applies themselves to the major problem in II-VI devices and help to make high temperature (in this case room temperature and above) operation a reality. The use of an MQB structure is particularly attractive in the II-VI material system due to the extreme variety of effective masses available to optimise such a structure.

In this embodiment, to improve the laser characteristics, various parameters were optimized in consideration of the same matters as in the previous embodiment. As a result, it was found that the same concepts as in the previous embodiment could be applied to the parameters.

That is, as the quantum well width was decreased, the interference effect between wells basically increased, thus further suppressing the overflow of carriers. When the MQB well width was increased, on the other hand, almost no interference effect could be obtained. This study on the MQB well width revealed that MQB laser characteristics would be improved if the MQB well width were in the range of 1 to 8 nm.

Since the transmission coefficient of electrons increases significantly for all energies if the barrier width decreases, eventually the barrier ceases to be what is thought of as a classical barrier. If the barrier width increases, on the other hand, the interference effect between the wells decreases, and makes it impossible to obtain a satisfactorily large effective MQB induced barrier height. It was also found that the position of the barriers affected their required characteristics. From this study on the effect of well width, it was found that a good result was obtained when the width of the first barrier in the p-type cladding layer 15 relative to the active layer 14 side was 24 to 100 nm, the width of the second barrier was 1 to 20 nm, and the widths of the third and subsequent barriers were 1 to 8 nm.

The number of barriers has an effect on the effective MQB barrier height. That is, it was found that an increase in number of MQB barriers enhanced the interference effect between the quantum wells. As a result, the effective MQB barrier height increased, and overflow of carriers decreased. However, the effective MQB barrier height saturated when the number of barriers exceeded a value. The present inventors made extensive studies on the number of barriers having this tendency and found that an appropriate number was 3 to 10. Note that potential Group II-VI semiconductor materials for the MQB barriers are for example $Zn_xMg_{1-x}S_ySe_{1-y}$ in place of $ZnS_xSe_{1-x}(ZnS_{0.1}Se_{0.9})$ and $Zn_xCd_{1-x}S_ySe_{1-y}$ used in this embodiment.

Group II-VI semiconductor materials potentially usable for MQB wells are for example, $ZnSe_xTe_{1-x}$, $Zn_xCd_{1-x}Se$, $ZnS_xTe_{1-x}$, $Zn_{1-x}Cd_xS$, and their mixed crystal $Zn_{1-x}Cd_xSe_{1-y-z}Te_z$ in place of $ZnS_xSe_{1-x}(ZnS_{0.1}Se_{0.9})$ used in this embodiment. Of the Group II elements, Zn, Cd, and Mg are particularly preferable. Of the Group VI elements, S, Se, and Te are particularly preferable. A high MQB effect can be expected by combining these Group II elements and Group VI elements.

Instead of the above materials, materials consisting of Group III-V elements, such as $In_{1-x}Ga_xAs_{1-y}P_y$, $Ga_{1-x}Al_xAs$, or $In_y(Ga_{1-x}Al_x)_{1-y}P$ can be used in the wells whereby the barriers are of a II-VI material. This is advantageous because not only is the range of conduction band offsets obtainable much larger but also the well effective masses will be substantially lower than that of the II-VI barriers thus enhancing the overall MQB effect.

As described above, when the individual parameters were set at the respective appropriate values, remarkable improvements could be obtained by a synergistic effect, i.e., an effect in which the result of a combination of various parameters is greater than that expected by examining the parameters individually.

According to this embodiment, therefore, the selection of the parameters as described above makes it possible to easily obtain a semiconductor laser device having excellent laser characteristics, such as a high maximum operating temperature, a low threshold current density, and the capability of short-wavelength oscillation.

Figure 12:
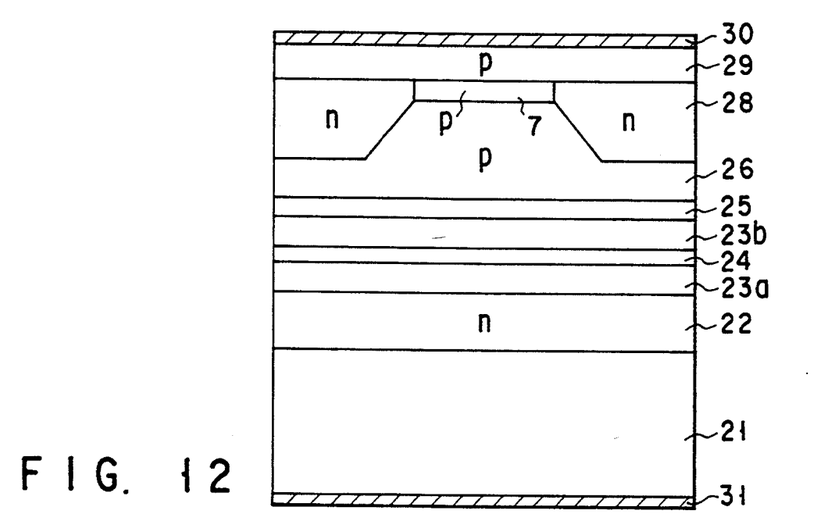
FIG. 12 is a sectional view showing the main part of an MQB laser according to another embodiment of the present invention.

FIG. 12 is a sectional view showing a main structure of a semiconductor laser device according to another embodiment of the present invention.

In the figure, reference numeral 21 represents a GaAs substrate, and this GaAs substrate 21 has an upper surface in the (100)-plane or at a plane inclined in the [011] direction from the (100) plane. On the GaAs substrate, an n-type cladding layer 22 of $In_{0.5}(Ga_{1-x}Al_x)_{0.5}P$ and having a thickness of 1 μm is grown.

On the n-type cladding layer 22, there is formed an active layer 24 made of undoped $In_{0.5}(Ga_{1-y}Al_y)_{0.5}P$ which is sandwiched between the two optical guide layers 23a and 23b.

The active layer 24 may be the light-emitting layer of any arbitrary structure, for example, may consist of a double hetero-structure or an MQW structure.

Figure 13:
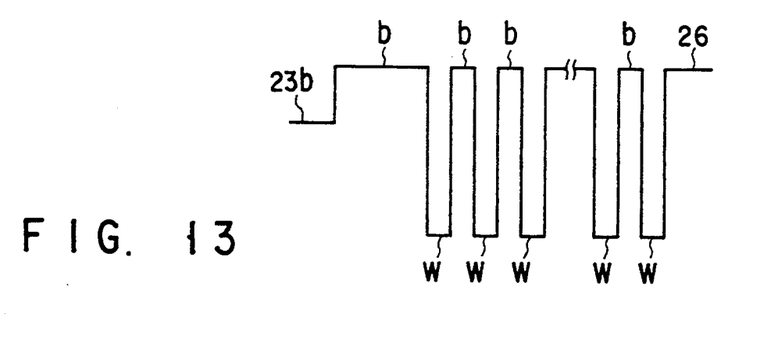
FIG. 13 is a view showing the conduction band edge profile of the MQB semiconductor laser shown in FIG. 12.

On the optical guide layer 23b, a p-type cladding layer 26 made of $In_{0.5}(Ga_{1-x}Al_x)_{0.5}P$ and having a thickness of about 1 μm is grown. On the optical guide layer 3b side of the p-type cladding layer 26, there is provided an MQB structure 25 including a plurality of barrier layers b and well layers w as shown in FIG. 13.

The material used for the barrier layers b in the MQB structure 25, was $In_{0.5}(Ga_{1-x}Al_x)_{0.5}P$, and the material used for the corresponding well layers w, $In_{1-u}Ga_uAs_{1-v}P_v$ was used. The composition variables x, u, and u are selected such that the effective mass of the electrons in each barrier layer b is larger than that in each well layer, and that this effective mass difference is larger than that of conventional MQB's. Further, a tensile strain is introduced into each well layer w. The reason for using such an MQB structure 25, and the specific values for the composition variables x, u, and v will be described below.

The center portion of the p-type cladding layer 26 is formed into a ridge shape. The p-type cladding layer 26 having a ridge structure was prepared by standard etching methods. The reason for forming the p-type cladding layer 26 into such a ridge shape was to confine the applied current as well as the emitted light in the direction perpendicular to the junction plane.

On the ridge portion of the p-type cladding layer 26, there is provided a p-type capping layer made of p-type InGaP. The remaining exposed portions of the p-type cladding layer 26 and the sides of the p-type capping layer 27 were covered by an n-type current blocking layer made of n-type GaAs.

On top of the n-type current blocking layer 28 and the p-type capping layer 27, there was formed a p-type electrode 30 via a p-type contact layer 29 made of p-type GaAs. On the opposite side of the GaAs substrate 21, there is provided an n-type electrode 31 made of an Au.Ge alloy.

The parameters for the optical guide layers 23a and 23b, and the cladding layers 22 and 26 are selected to comply with those for $In_{0.5}(Ga_{1-x}Al_x)_{0.5}P$ semiconductor lasers. Each of the above-mentioned semiconductor layers is grown by CVD methods including the MOCVD method.

The reason for using the MQB structure 25 as mentioned above will now be described.

In order to lessen the amount of electrons leaking from the active layer 24 into the p-type cladding layer 26, the MQB induced barrier should be maximized. The height of the MQB induced barrier the depends upon the depth of the well layer w, and the offset ($m_{off}=m_b{}^*-m_w{}^*$) between the effective mass of electrons in the barrier layer b ($m_b{}^*$) and the effective mass ($m_w{}^*$) of electrons in the well layer w.

There is a linear correlation between the depth of the well layer w and the MQB effect (i.e. the height of the MQB induced barrier). One way to enhance the MQB effect is by deepening the depth of the well layer w by increasing the composition parameter x of $In_{0.5}(Ga_{1-x}Al_x)_{0.5}P$ used as the barrier layer b.

However, since it becomes more difficult to dope as x goes from 0.7 to 1.0, the parameter x is normally set at 0.7, which is also the alloys upper limit for a direct band gap material. Thus, the only one remaining variable for enhancing the MQB effect by changing the depth of the well layer w, is the band gap of the well layer w.

When the band gap of the well layer w approaches, or becomes less than that of the active layer 24, the light radiated from the active layer 24 is absorbed in the well layer w, causing a substantial laser loss. Consequently, although the depth of the wells can be deepened by introducing compressive strain into them, the loss due to the active regions emission absorption overcomes the increase in MQB barrier height induced by the well depth change. This is because the wells band gap decreases when compressive strain is introduced into the well layers w. On the other hand, when tensile strain is introduced into the well layers w, the depth of the well decreases, thereby reducing the MQB effect. Therefore, due to the aforementioned problems it is not easy to remarkably increase the MQB effect by changing the depth of the well layer w.

An improvement of the MQB effect achieved by altering the offset $m_{off}$ of the electron effective mass $m_b{}^*$ in the barrier layers b and the electron effective mass $m_w{}^*$ in the well layers w, will now be described.

Figure 14:
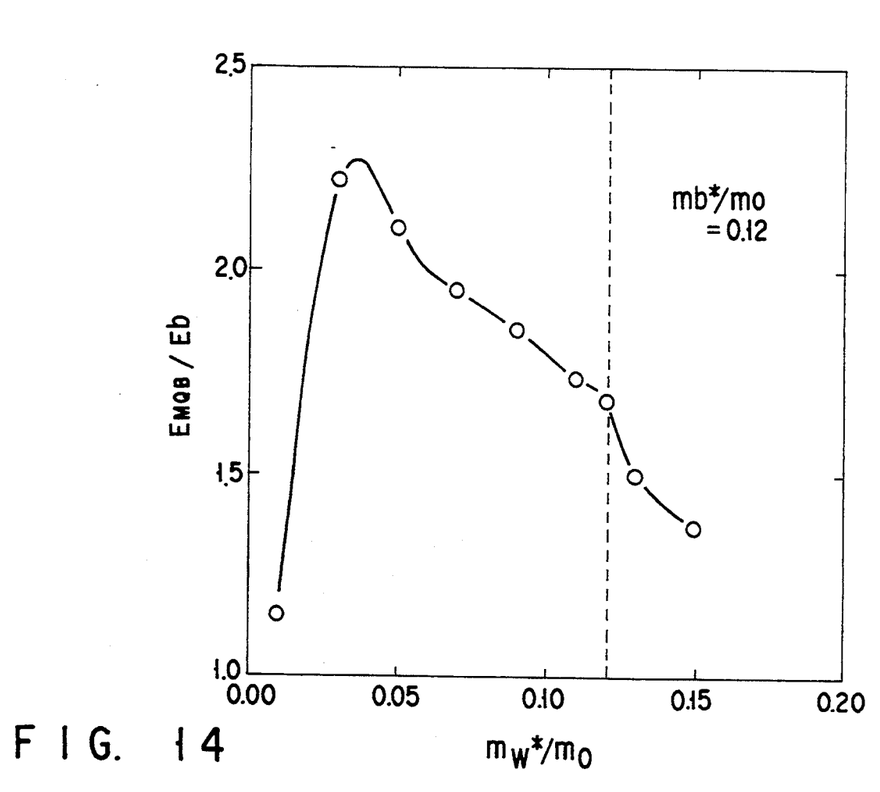
FIG. 14 is a graph showing the correlation between the effective mass $m_w^*$ of the well layer w and the MQB effect in the case where the ratio of the effective mass $m_b^*$ of electrons in the barrier layer b to the mass $m_0$ of electrons in free space ($m_b^*/m_0$) is fixed at 0.12.

FIG. 14 is a graph showing the correlation between the effective mass $m_w{}^*$ of the well layer w and the MQB effect in the case where the ratio of the effective mass $m_b{}^*$ of electrons in the barrier layers b to the mass $m_0$ of electrons in free space ($m_b{}^*/m_0$) is fixed to 0.12. It should be noted that in this case the number of pairs of well and barrier layers is 10. In FIG. 14, the horizontal axis indicates the effective mass $m_w{}^*$ of the electrons in the well layers as standardized in terms of the effective mass $m_0$ of the electrons in free space, whereas the vertical axis indicates the height $E_{MQB}$ of the barrier due to the MQB effect standardized in terms of the classical height $E_b$ of a quasi bulk layer with a composition ratio equal to that in the MQB barrier layer.

As is clear from FIG. 14, when $m_w{}^*/m_0$ is 0.12, that is, when the offset $m_{off}$ is zero, $E_{MQB}/E_b$ is about 1.6. Also, as $m_w{}^*/m_0$ is reduced to 0.03, that is, the offset $m_{off}$ is increased to 0.09, $E_{MQB}/E_b$ (MQB effect) steadily increases.

When $m_w{}^*/m_0$ is reduced below 0.03, $E_{MQB}/E_b$ rapidly decreases, whereas when $m_w{}^*/m_0$ becomes larger than 0.12, in other words, in the case of $m_w{}^*>m_b{}^*$, $E_{MQB}/E_b$ monotonously decreases. Such a tendency was also observed in other MQB structures. With respect to the typical $In_{0.5}(Ga_{1-x}Al_x)_{0.5}P$ laser MQB structure, the $m_w{}^*/m_0$ value of an InGaP well is estimated to be 0.11.

Figure 15:
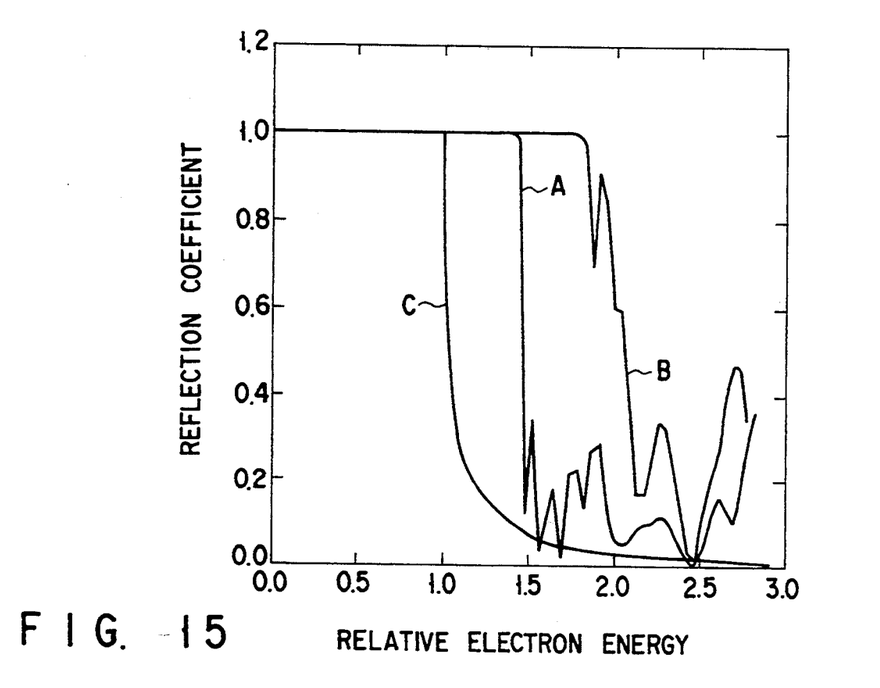
FIG. 15 is a graph showing the relationship between the electron reflection coefficient of the MQB and the relative electron energy.

In order to increase the effective mass offset, for example, the effective mass of the electrons in the well layer should be decreased. FIG. 15 shows the correlation between the relative electron energy (obtained by dividing the energy of electrons in the active region by the energy equivalent of the classical barrier height, and the reflection coefficient of the incident electrons. Please note that MQB structure, the reason for which will be explained later, with the tensile strain introduced into it is represented by curve B.

As can be seen from FIG. 15, the smaller the effective mass of the electrons in the well layer, the larger the value of the reflection coefficient for high energy electrons. In other words, as the effective mass is decreased, an MQB can be formed having a barrier height large enough to suppress high-energy overflow electrons.

There are many semiconductor materials which has a good lattice matching property with GaAs and a small electron effective mass. However, with materials of such a type, it is generally true that the smaller the electron effective mass, the smaller the associated band gap. As a result, the light emission produced in the active region 24 of the device will be heavily absorbed by such MQB well layers w constituting a large loss mechanism.

In order to solve this problem, for example, tensile strain should be introduced into the well layers. When tensile strain is introduced into the well layers, the well band gap increases. Further, the state of the conducting band does not vary much despite of the introduction of the tensile strain, and the effective mass remains substantially the same.

In order to maximize the MQB effect by decreasing the effective mass of electrons in the well layers without changing the effective well band gap, the maximum tensile strain which the material of the well layer can sustain comfortably must be selected to maximise the effective mass offset producible.

The maximum amount of tensile strain usable is determined by the critical thickness of a material. So called because if the strained layer thickness exceeds this critical value, many defects including dislocations occur in the well layers, i.e., the crystallinity of the layer is compromised. Therefore, the maximum usable tensile strain is determined by the critical thickness and the total thickness of the well layers into which the tensile strain is introduced. The maximum tensile strain generally used in most other applications (e.g. strained MQB's) falls within the order of $\Delta a/a = -1\%$ where a represents the substrates lattice constant.

In many cases, the total thickness of the well layers in the MQB structure are relatively thin (i.e. in comparison to other semiconductor layers employing strain), and it is sometimes possible, depending on the type of MQB structure, to use strain in the order of $\Delta a/a = -2\%$.

Semiconductor materials appropriate for well layers are thus selected in consideration of their band gaps, the maximum value of the tensile strain usable, and the appropriate thickness of the well layers. One of the most appropriate materials for the well layers in InGaAlP laser is the $In_{1-u}Ga_uAs_{1-v}P_v$ mixed crystal semiconductor, which is used as the example in the embodiments of the present invention. This mixed crystal semiconductor has a band gap of an appropriate order, in consideration of tensile strain and quantum confinement effects, for the optimization of MQB lasers.

Preferable values for the parameters u and v are found within the ranges $0<u<0.45$ and $0.6>v>1$, respectively. When the parameters u and v of $In_{1-u}Ga_uAs_{1-v}P_v$ are set within the above ranges respectively, there was obtained well layers having an effective mass as small as 0.04–0.10 relative to $m_0$ (the mass of an electron in free space). Further, this effective mass range falls within the range in which an increase in the MQB effect can be obtained, from FIG. 14.

Further, it is preferable that the parameter x of $In_{0.5}(Ga_{1-x}Al_x)_{0.5}P$, which constitutes the barrier layer b, should fall within the range of 0.7–1.0.

Thus, according to the embodiment, different semiconductor materials are used for the well layers w ($In_{1-u}Ga_uAs_{1-v}P_v$) and the barrier layers b ($In_{0.5}(Ga_{1-x}Al_x)_{0.5}P$). With this structure, the effective mass $m_w^*$ of the well layer w can be made smaller than by using more conventional methods. Consequently, the reflection coefficient is increased enough to suppress the overflow of electrons, and the usually associated reduction of the band gap can be avoided by introducing tensile strain into the well layers w. Therefore, even at shorter than presently achievable wavelengths, practical semiconductor laser devices can have such premium characteristics as low threshold current density values and high maximum operating temperatures.

It should be noted that the present invention is not limited to the above-described embodiment. For example, in the embodiment, InGaAlP and InGaAsP mixed crystal semiconductors were used as the materials of the well and barrier layers, respectively, but a similar effect can be obtained by use of other materials such as Al-GaAs and InGaAsP mixed crystal semiconductors as well as the whole range of II–VI materials and various combinations of II–VI and III–V semiconductor structures.

Or, in place of decreasing the effective mass of the electrons in the well layer by appropriately selecting semiconductor materials for the well layer, the offset of the effective mass may be increased by raising the effective mass of the electrons in the barrier layer to have a similar overall effect.

Further, the MQB structure may be introduced into the n-type cladding layer, as it is in the p-type cladding layer.

As described above, according to the above embodiment, laser characteristics such as the threshold current density and the maximum operating temperature are improved, and therefore a more practical semiconductor laser device capable of short wavelength oscillation can be obtained.

What is claimed is:

1. A semiconductor laser device comprising:
a substrate;
a first cladding layer formed on said substrate;
an active layer formed on said first cladding layer; and
a second cladding layer formed on said active layer having a conductivity type different from that of said first cladding layer,
wherein at least one of said first and second cladding layers has a multiquantum barrier structure including a plurality of barrier layers and a plurality of well layers formed of a material different from that of the barrier layers, each barrier layer and each well layer being alternately stacked, an effective mass of electrons in said barrier layer being larger than that in said well layer, a width of a first barrier layer relative to a side of said active layer being 24 to 100 nm, with tensile strain, represented by the following inequality, being introduced into said well layers $$-2\% > \Delta a/a > -1\%$$

(where a is a lattice constant of the substrate, and $\Delta a$ is a difference between the lattice constant of the well layer and that of the substrate.)

2. A device according to claim 1, wherein the width of a second barrier layer counted from the side of said active layer is 1 to 20 nm.

3. A device according to claim 1, wherein widths of third and subsequent barrier layers counted from the side of said active layer are 1 to 8 nm.

4. A device according to claim 1, wherein a width of each well of said multiquantum barrier structure is 1 to 8 nm.

5. A semiconductor laser device comprising:
a substrate;
a first cladding layer formed on said substrate;
an active layer formed on said first cladding layer; and
a second cladding layer formed on said active layer having a conductivity type different from that of said first cladding layer,
wherein at least one of said first and second cladding layers has a multiquantum barrier structure, and said multiquantum barrier structure is constituted by alternately stacking a plurality of barrier layers each consisting essentially of $In_z(Ga_{1-x}Al_x)_{1-z}P$ (x is 0.7 to 1.0 and z is 0 to 0.5) and a plurality of well layers each consisting essentially of $In_{1-u}Ga_uAs_{1-v}P_v$ (u is 0 to 0.45 and v is 0.6 to 1), a width of the first barrier layer relative to a side of said active layer being 24 to 100 nm, a width of the second barrier layer relative to a side of said active layer being 5 to 20 nm, tensile strain, represented by the following inequality, being introduced into said well layers $$-2\% > \Delta a/a > -1\%$$

(where a is a lattice constant of the substrate, and $\Delta a$ is a difference between the lattice constant of the well layer and that of the substrate.)

* * * * *